United States Patent
Tomabechi

(10) Patent No.: US 9,379,230 B2
(45) Date of Patent: Jun. 28, 2016

(54) SEMICONDUCTOR CRYSTAL SUBSTRATE, MANUFACTURING METHOD OF SEMICONDUCTOR CRYSTAL SUBSTRATE, MANUFACTURING METHOD OF SEMICONDUCTOR DEVICE, POWER UNIT, AND AMPLIFIER

(75) Inventor: Shuichi Tomabechi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 278 days.

(21) Appl. No.: 13/554,117

(22) Filed: Jul. 20, 2012

(65) Prior Publication Data

US 2013/0069072 A1    Mar. 21, 2013

(30) Foreign Application Priority Data

Sep. 16, 2011    (JP) ................................. 2011-203793

(51) Int. Cl.
| | | |
|---|---|---|
| H01L 29/778 | (2006.01) | |
| H01L 29/20 | (2006.01) | |
| H01L 21/02 | (2006.01) | |
| H01L 29/423 | (2006.01) | |

(52) U.S. Cl.
CPC ........ H01L 29/7787 (2013.01); H01L 29/2003 (2013.01); *H01L 21/0237* (2013.01); *H01L 21/0254* (2013.01); *H01L 21/0259* (2013.01); *H01L 21/02381* (2013.01); *H01L 21/02667* (2013.01); *H01L 29/4236* (2013.01)

(58) Field of Classification Search
None
See application file for complete search history.

(56) References Cited

U.S. PATENT DOCUMENTS

| | | | | |
|---|---|---|---|---|
| 5,844,256 A | * | 12/1998 | Higashino | ........................ 257/66 |
| 2003/0104681 A1 | * | 6/2003 | Davari et al. | .................. 438/480 |
| 2004/0043585 A1 | * | 3/2004 | Moore et al. | .................. 438/510 |
| 2007/0284762 A1 | * | 12/2007 | Barber et al. | .................. 257/797 |
| 2011/0278598 A1 | * | 11/2011 | Renaud | ............................ 257/77 |

FOREIGN PATENT DOCUMENTS

| | | |
|---|---|---|
| CN | 1129967 | 12/2003 |
| JP | 2002-359256 A1 | 12/2002 |
| JP | 2009-256154 A1 | 11/2009 |
| JP | 2011171595 | 9/2011 |
| TW | 201036145 | 10/2010 |

OTHER PUBLICATIONS

1 Foreign Office Action dated Sep. 29, 2014. Application No. 201210266834.8.
Office Action mailed on Oct. 24, 2014, with respect to the corresponding Taiwanese Application No. 101126997.
Office Action mailed on Apr. 14, 2015, issued with respect to counterpart Japanese Patent Application No. 2011-203793, with partial translation.
Office action dated Apr. 29, 2015, in counterpart CN application No. 201210266834.8.

* cited by examiner

*Primary Examiner* — Davienne Monbleau
*Assistant Examiner* — Scott R Wilson
(74) *Attorney, Agent, or Firm* — Kratz, Quintos & Hanson, LLP

(57) ABSTRACT

A semiconductor crystal substrate includes a substrate; and a protection layer formed by applying nitride on a surface of the substrate. The protection layer is in an amorphous state in a peripheral area at an outer peripheral part of the substrate, and the protection layer is crystallized in an internal area of the protection layer that is inside the peripheral area of the protection layer.

11 Claims, 7 Drawing Sheets

SEMICONDUCTOR CRYSTAL SUBSTRATE, MANUFACTURING METHOD OF SEMICONDUCTOR CRYSTAL SUBSTRATE, MANUFACTURING METHOD OF SEMICONDUCTOR DEVICE, POWER UNIT, AND AMPLIFIER

CROSS-REFERENCE TO RELATED APPLICATION

This patent application is based upon and claims the benefit of priority of the prior Japanese Patent Application No. 2011-203793 filed on Sep. 16, 2011, the entire contents of which are incorporated herein by reference.

FIELD

The embodiments discussed herein are related to a semiconductor crystal substrate, a manufacturing method of the semiconductor crystal substrate, a manufacturing method of a semiconductor device, a power unit, and an amplifier.

BACKGROUND

GaN, AlN, InN, which are nitride semiconductors, or materials made of mixed crystals thereof, have a wide band gap, and are used as high output electronic devices or short-wavelength light emitting devices. Among these, as high output electronic devices, technologies are developed in relation to Field Effect Transistors (FET), more particularly, High Electron Mobility Transistors (HEMT) (see, for example, Japanese Laid-Open Patent Publication No. 2002-359256). A HEMT using such a nitride semiconductor is used for high output/high efficiency amplifiers and high power switching devices.

Among nitride semiconductors, GaN has a polarity in a (0001) direction parallel to a c-axis (wurtzite form), and therefore, when a hetero structure of AlGaN/GaN is formed, piezo polarization is excited by lattice distortion of both AlGaN and GaN. Accordingly, in an AlGaN layer near the interface, high concentrations of Two-Dimensional Electron Gas (2DEG) are generated. Thus, GaN and materials including GaN are promising as materials of high frequency/electronic devices.

An example of HEMT using such a nitride semiconductor is formed by forming an AlN protection layer and an AlGaN buffer layer on a substrate made of, for example, silicon (Si), and forming a GaN electron transit layer and an AlGaN electron supply layer on the AlGaN buffer layer. However, when these semiconductor layers are caused to grow epitaxially on a silicon substrate, distortions are caused in the semiconductor layer due to differences in lattice constants between the semiconductor layers and the substrate and differences in thermal expansion coefficients between the semiconductor layers and the substrate. Accordingly, defects referred to as so-called cracks appear on the surface of the semiconductor layers. As illustrated in FIG. 1, these cracks 910 tend to be generated on the outer periphery of a substrate 920. These cracks 910 cause chipping and dust, and decrease the yield of the HEMT that is the semiconductor device to be manufactured.

In order to prevent the cracks 910 from being formed on the outer periphery of the substrate 920, there is disclosed a method of forming a protection film such as silicon nitride along the outer periphery of a substrate, and causing epitaxial growth by MOCVD (Metal Organic Chemical Vapor Deposition) (see, for example, Japanese Laid-Open Patent Publication No. 2009-256154).

Incidentally, as illustrated in FIG. 2, when a protection layer 930 such as silicon nitride is formed on the outer periphery of the substrate 920, a buffer layer 940 and a semiconductor layer 941 do not grow epitaxially on the protection layer 930, and therefore the buffer layer 940 and the semiconductor layer 941 are not formed on the protection layer 930. However, near the area where the protection layer 930 is formed, the source gas, which is supposed to be deposited in the area where the protection layer 930 is formed, diffuses from the protection layer 930. Therefore, there are cases where the buffer layer 940 and the semiconductor layer 941 grow abnormally. When abnormal growth is caused near the protection layer 930, the buffer layer 940 and the semiconductor layer 941 may become thick near the protection layer 930. Furthermore, the formed buffer layer 940 and the semiconductor layer 941 may have compositions and doping densities that are different from desired values. Furthermore, it is technically difficult to form the protection layer 930 only on the outer periphery of the substrate 920, and therefore costs may be increased.

SUMMARY

According to an aspect of the embodiments, a semiconductor crystal substrate includes a substrate; and a protection layer formed by applying nitride on a surface of the substrate, wherein the protection layer is in an amorphous state in a peripheral area at an outer peripheral part of the substrate, and the protection layer is crystallized in an internal area of the protection layer that is inside the peripheral area of the protection layer.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
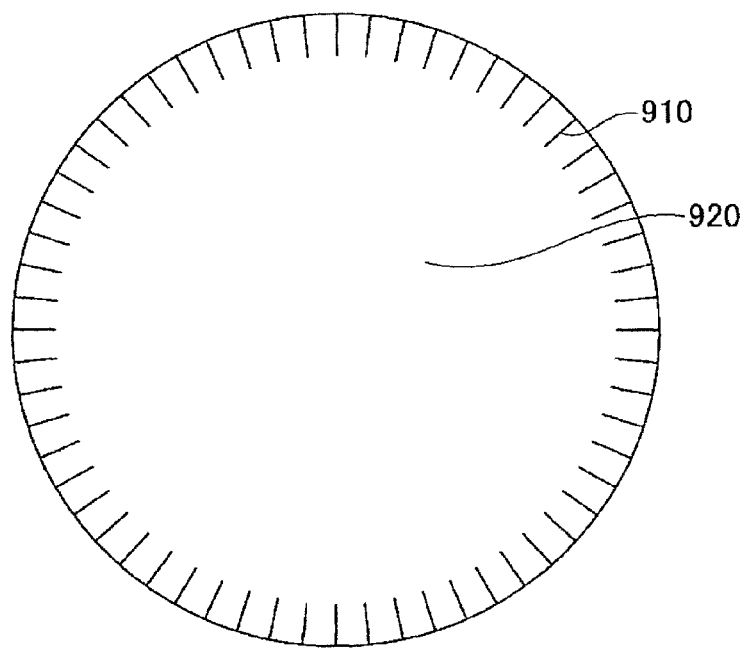
FIG. 1 illustrates cracks formed in a semiconductor film epitaxially grown on a substrate.
Figure 2:
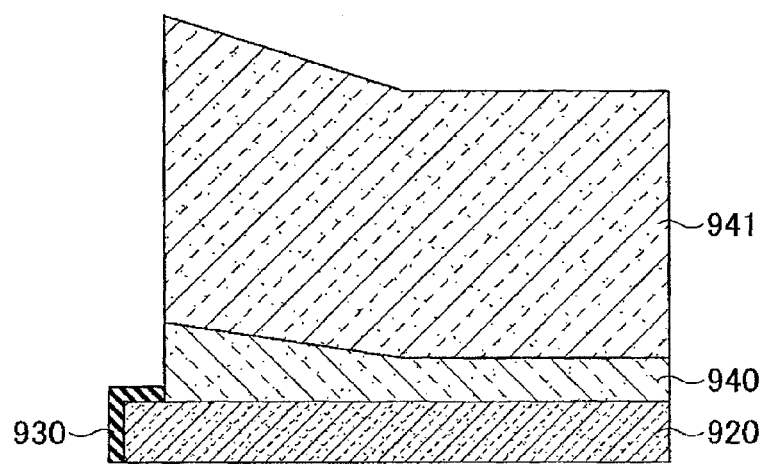
FIG. 2 illustrates a semiconductor layer laminated on a substrate on which a protection film is formed on the periphery.

Preferred embodiments of the present invention will be explained with reference to accompanying drawings. The same elements are denoted by the same reference numerals and overlapping descriptions are omitted.

First Embodiment

A description is given of a semiconductor crystal substrate and a manufacturing method of the semiconductor crystal substrate according to a first embodiment, with reference to FIGS. 3A through 5.

Figure 3A:
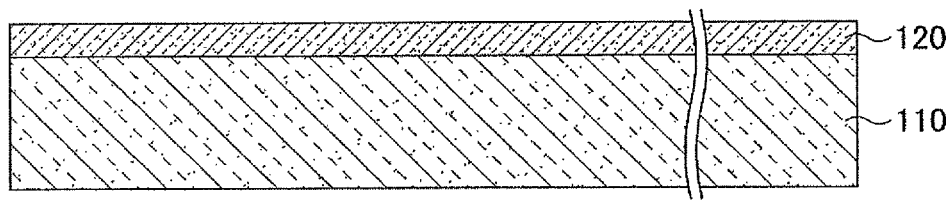
FIGS. 3A through 3C illustrate processes of a method of manufacturing a semiconductor crystal substrate and a semiconductor device according to a first embodiment (part 1)

First, as illustrated in FIG. 3A, an AlN layer 120 acting as a protection layer is formed by an ALD (Atomic Layer Deposition) method on a silicon substrate 110 having a surface (111) as a substrate. In the present embodiment, the silicon substrate 110 having a surface (111) is used as a substrate; however, the substrate may be made of materials other than silicon, such as sapphire, silicon carbide, and gallium nitride. The AlN layer 120 is formed for mitigating the lattice constant with respect to a semiconductor layer such as GaN to be formed on the AlN layer 120, mitigating the coefficient of thermal expansion, and preventing a Ga atom from moving from the semiconductor layer such as GaN to the silicon substrate 110. Immediately after the AlN layer 120 is formed on the silicon substrate 110 by the ALD method, the AlN layer 120 is in a polycrystal state.

Figure 3B:
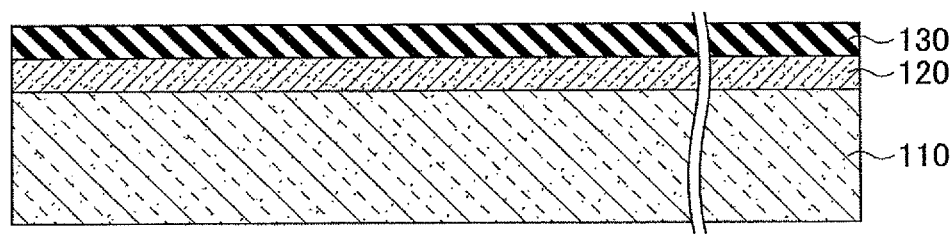

Next, as illustrated in FIG. 3B, a SiN layer 130 is formed on the AlN layer 120. The SiN layer 130 is formed on the entire surface of the AlN layer 120 by a film forming method such as sputtering.

Figure 3C:
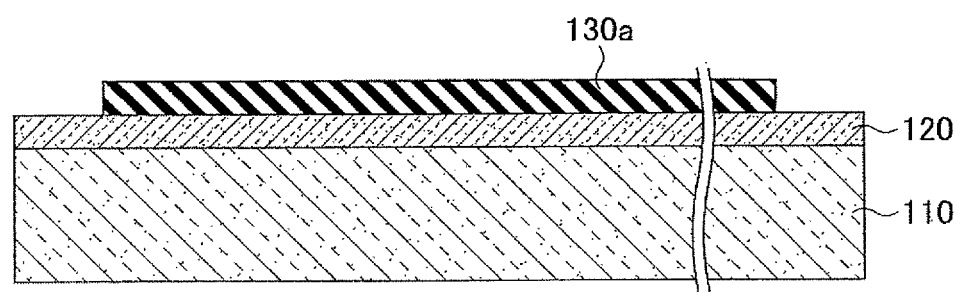

Next, as illustrated in FIG. 3C, parts of the SiN layer 130 on the outer periphery of the silicon substrate 110 is removed. Specifically, photoresist is applied on the SiN layer 130, and exposure and developing is performed with an exposing device, thereby forming a resist pattern (not illustrated) in the area other than the periphery of the silicon substrate 110. Subsequently, by performing etching such as RIE (Reactive Ion Etching), parts of the SiN layer 130 in areas where the resist pattern is not formed are removed. As described above, parts of the SiN layer 130 on the periphery of the silicon substrate 110 are removed, and a mask layer is formed by the remaining SiN layer 130a. The resist pattern (not illustrated) is subsequently removed with an organic solvent.

Figure 4A:
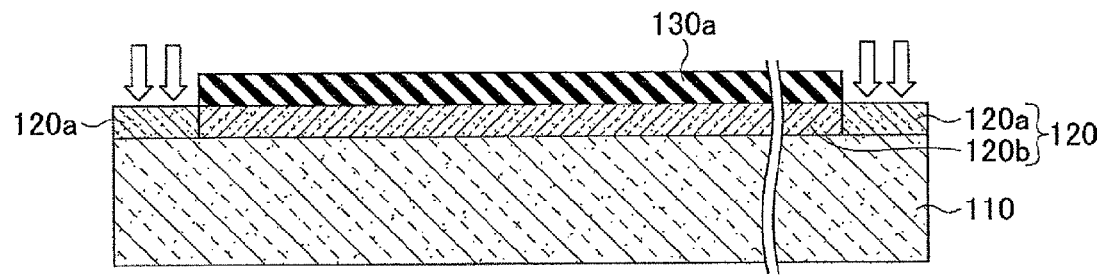
FIGS. 4A through 4C illustrate processes of a method of manufacturing a semiconductor crystal substrate and a semiconductor device according to the first embodiment (part 2)

Next, as illustrated in FIG. 4A, the surface of the silicon substrate 110 on which the SiN layer 130a acting as a mask layer is formed, is exposed to oxygen plasma. Accordingly, a surrounding area 120a, where the SiN layer 130a is not formed and the AlN layer 120 is exposed, is turned into AlON or AlO. As described above, by exposing the surface where the AlN layer 120 to oxygen plasma, oxygen is implanted into the surrounding area 120a of the AlN layer 120, and the composition of the AlN layer 120 at the surrounding area 120a is turned into AlON. Therefore, in the AlN layer 120, more oxygen is included in the surrounding area 120a, compared to an internal area 120b, which is the area of the AlN layer 120 other than the surrounding area 120a.

In the present embodiment, a plasma CVD (Chemical Vapor Deposition) device is used to expose the surface of the silicon substrate 110 where the AlN layer 120 is exposed, to oxygen plasma. The composition of the AlN layer 120 in the surrounding area 120a is turned into AlON. As described above, when the composition of the AlN layer 120 in the surrounding area 120a is turned into AlON, the crystal state of the surrounding area 120a becomes an amorphous state. The area of the AlN layer 120 covered by the SiN layer 130a to act as a mask layer is not directly exposed to oxygen plasma, and therefore this area of the AlN layer 120 is not turned into AlON or AlO. Furthermore, the method of implanting oxygen into the AlN layer 120 at the periphery of the silicon substrate 110 may be another method, such as ion-implanting oxygen into the surrounding area 120a of the AlN layer 120.

Figure 4B:
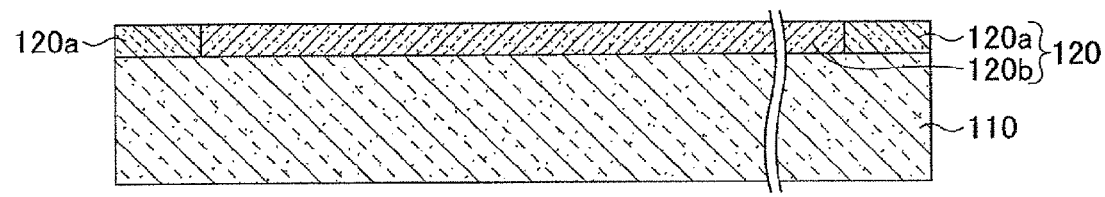

Next, as illustrated in FIG. 4B, after removing the SiN layer 130a acting as the mask layer, the substrate is heated. Specifically, the SiN layer 130a is removed by hydrofluoric acid, and the substrate is put inside a chamber of a MOCVD device, and the temperature inside the chamber is increased to approximately 1000° C. to heat the substrate. By heating the substrate as described above, the internal area 120b of the AlN layer 120 that had been covered by the SiN layer 130a acting as a mask layer is rearranged and single-crystallized. However, in the surrounding area 120a, oxygen is implanted and the composition is turned into AlON, and therefore the surrounding area 120a remains in an amorphous state without being single-crystallized. Accordingly, a semiconductor crystal substrate is created, in which the AlN layer 120 is formed on the semiconductor crystal substrate according to the present embodiment, i.e., the silicon substrate 110, the surrounding area 120a of the AlN layer 120 is in an amorphous state, and the internal area 120b is crystallized. In the present embodiment, the internal area 120b of the AlN layer 120 is rearranged and single-crystallized, and therefore the heating is performed from approximately several minutes to several hours.

Figure 4C:
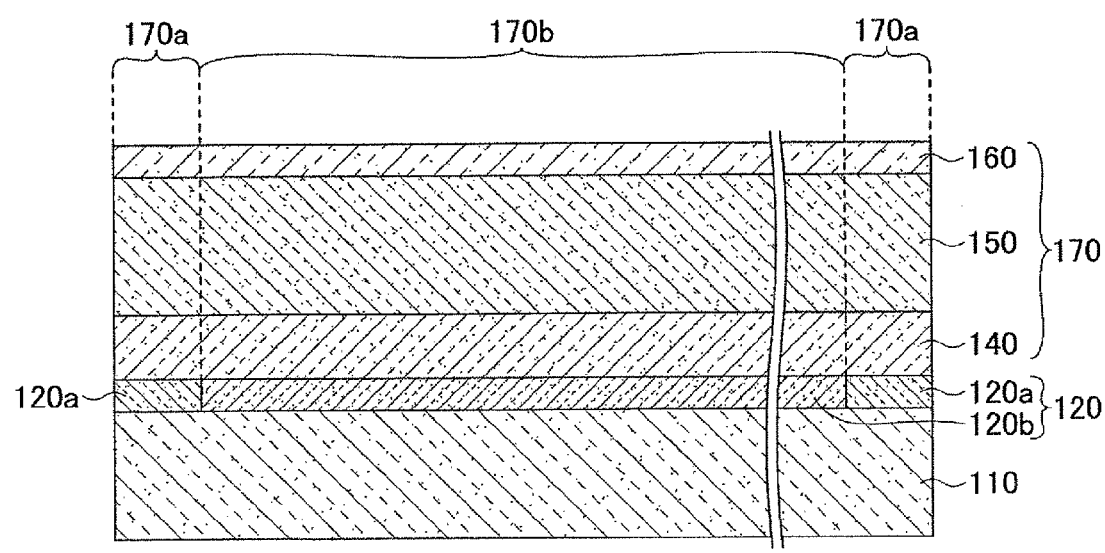

Next, as illustrated in FIG. 4C, an AlGaN layer 140 that is a buffer layer, a GaN layer 150 that is an electron transit layer, and an AlGaN layer 160 that is an electron supply layer are formed and laminated by MOCVD, on the AlN layer 120. In the present embodiment, a film in which the AlGaN layer 140, the GaN layer 150, and the AlGaN layer 160 are laminated may be described as a semiconductor layer 170. Accordingly, on the single-crystallized internal area 120b of the AlN layer 120, the semiconductor layer 170 grows epitaxially, and therefore a crystallized semiconductor layer 170b is formed. Meanwhile, on the surrounding area 120a that is in an amorphous state, the semiconductor layer 170 is deposited without growing epitaxially, and therefore a semiconductor layer 170a in an amorphous state is formed.

On the semiconductor layer 170a in an amorphous state, rearrangement is not caused, and therefore cracks are prevented from being formed in the semiconductor layer 170 on the outer periphery of the silicon substrate 110. Furthermore, also on the surrounding area 120a, the semiconductor layer 170a in the amorphous state is deposited, and therefore the crystallized semiconductor layer 170b does not abnormally grow on the internal area 120b near the surrounding area 120a. In the present embodiment, the GaN layer 150 that is an electron transit layer is formed by i-GaN having a thickness of approximately 1 μm through 3 μm. The AlGaN layer 160 that is an electron supply layer is formed by n-$Al_{20}Ga_{80}N$ of approximately 20 nm, and is doped with $5 \times 10^{18}$ $cm^{-3}$ of Si as an impurity element. The buffer layer, the electron transit layer, and the electron supply layer may be made of different compound semiconductive materials, such as different nitride semiconductive materials. Furthermore, the electron supply layer may be formed by an InAlN layer instead of the AlGaN layer 160.

Figure 5:
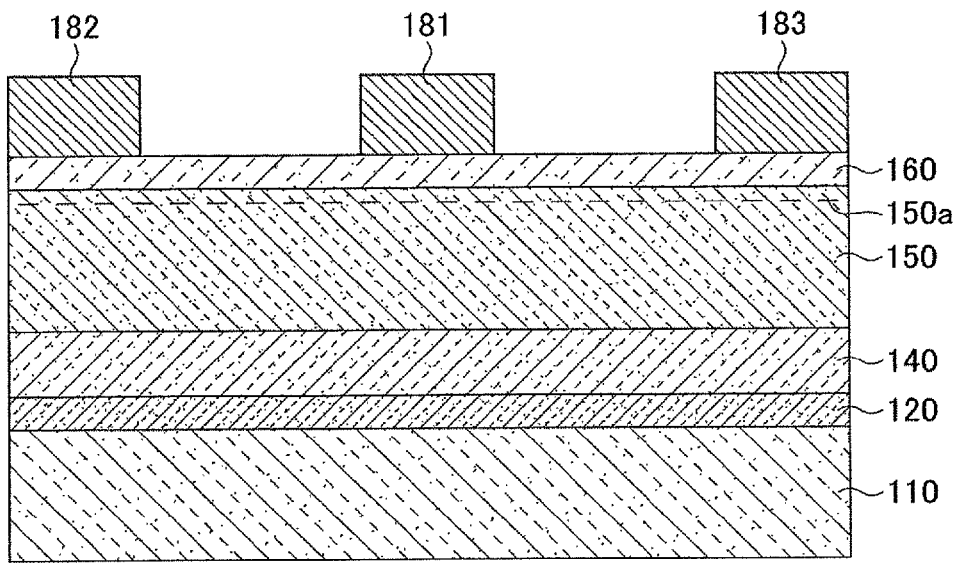
FIG. 5 illustrates a semiconductor device according to the first embodiment.

Next, as illustrated in FIG. 5, on the AlGaN layer 160, a gate electrode 181, a source electrode 182, and a drain electrode 183 are formed, and the silicon substrate 110 is separated with a dicing saw. In the semiconductor device according to the present embodiment, 2DEG 150a is formed in the GaN layer 150 near the interface between the GaN layer 150 and the AlGaN layer 160. Accordingly, it is possible to manufacture a semiconductor chip of HEMT that is the semiconductor device according to the present embodiment.

In the present embodiment, cracks are not formed in the semiconductor layer 170 on the periphery of the silicon substrate 110, and therefore the yield in manufacturing the semiconductor device is increased, and the semiconductor device is manufactured at low cost.

Second Embodiment

Next, a description is given of a second embodiment. The semiconductor device according to the present embodiment is a HEMT that becomes a normally-off type by forming a gate recess and an insulating film.

Figure 6:
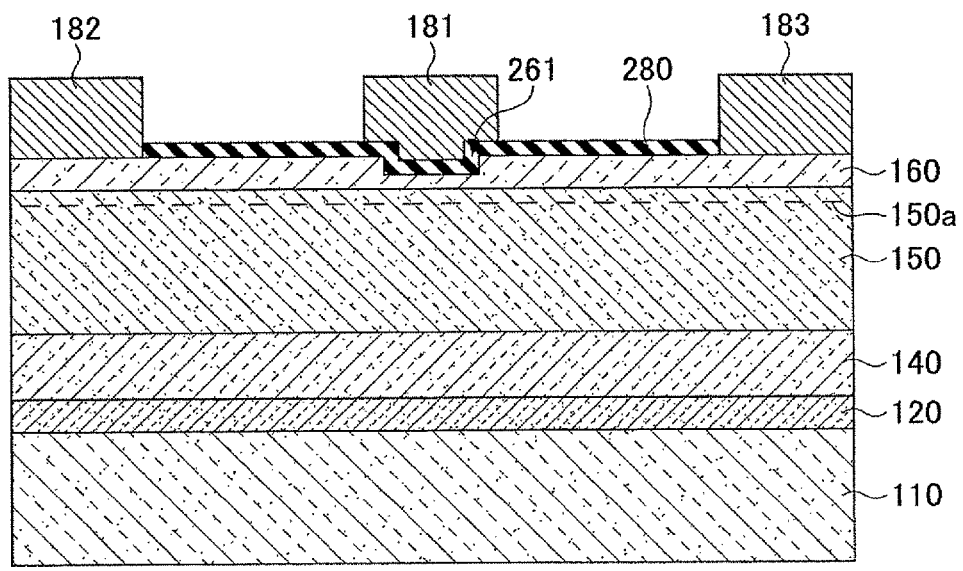
FIG. 6 illustrates a semiconductor device according to a second embodiment.

FIG. 6 illustrates a structure of HEMT that is the semiconductor device according to the present embodiment. In the semiconductor device according to the present embodiment, a gate recess 261 is formed in the AlGaN layer 160, and an insulating film 280 is formed on the AlGaN layer 160 in which the gate recess 261 is formed. The source electrode 182 and the drain electrode 183 are formed in contact with the AlGaN layer 160.

The semiconductor device according to the present embodiment is manufactured by forming the gate recess 261 in the AlGaN layer 160 illustrated in FIG. 4C of the first embodiment, forming the insulating film 280, and forming the gate electrode 181, the source electrode 182, and the drain electrode 183.

The gate recess 261 is formed by the following method. First, photoresist is applied on the surface of the AlGaN layer 160, and exposure and developing is performed with an exposing device, thereby forming a resist pattern (not illustrated) having an opening in an area where the gate recess 261 is to be formed. Subsequently, by performing dry etching such as RIE, parts of the AlGaN layer 160 where the resist pattern is not formed are removed. The resist pattern (not illustrated) is subsequently removed with an organic solvent.

The method of forming the insulating film 280 involves forming an aluminum oxide film of approximately 10 nm on the AlGaN layer 160 on which the gate recess 261 is formed, by CVD, ALD, and sputtering.

In the method of forming the gate electrode 181, photoresist is first applied on the insulating film 280, and exposure and developing is performed with an exposing device, thereby forming a resist pattern (not illustrated) having an opening in the area where the gate electrode 181 is to be formed. Subsequently, a metal film is formed on the entire surface by vacuum vapor deposition, and lift-off is performed by dipping this in an organic solvent.

In the method of forming the source electrode 182 and the drain electrode 183, photoresist is applied on the insulating film 280, and exposure and developing is performed with an exposing device, thereby forming a resist pattern (not illustrated) having openings in the areas where the source electrode 182 and the drain electrode 183 are to be formed. Subsequently, the insulating film 280 in the areas of the openings of the resist pattern is removed by etching, a metal film is formed on the entire surface by vacuum vapor deposition, and lift-off is performed by dipping this in an organic solvent.

Accordingly, the semiconductor device according to the present embodiment is manufactured. Contents other than the above are the same as the first embodiment.

Third Embodiment

Next, a description is given of a third embodiment. The present embodiment is pertinent to a semiconductor device, a power unit, and a high-frequency amplifier.

Figure 7:
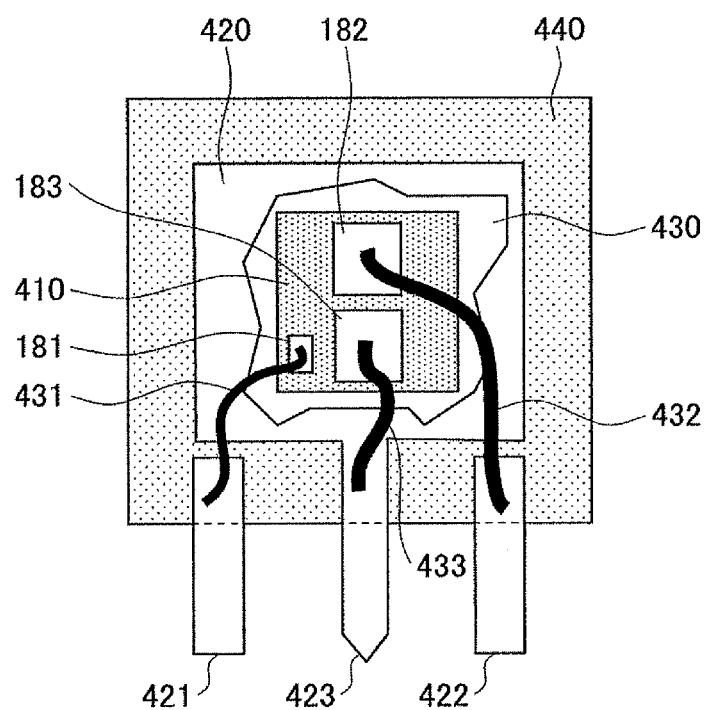
FIG. 7 illustrates a discretely packaged semiconductor device according to a third embodiment.

The semiconductor device according to the present embodiment is formed by discretely packaging the semiconductor device. The discretely packaged semiconductor device is described with reference to FIG. 7. FIG. 7 schematically illustrates the inside of the discretely packaged semiconductor device, in which the arrangements of the electrodes are different from those of the first and second embodiments.

First, the semiconductor device manufactured according to the first and second embodiments is cut by dicing, and a semiconductor chip 410 that is a HEMT made of a GaN system material is formed. The semiconductor chip 410 is fixed on a lead frame 420 by a diatouch agent 430 such as solder. The semiconductor chip 410 corresponds to the semiconductor device according to the first embodiment illustrated in FIG. 5, or the semiconductor device according to the second embodiment illustrated in FIG. 6.

Next, the gate electrode 181 is connected to a gate lead 421 by a bonding wire 431, the source electrode 182 is connected to a source lead 422 by a bonding wire 432, and the drain electrode 183 is connected to a drain lead 423 by a bonding wire 433. The bonding wires 431, 432, and 433 are formed by a metal material such as Al. Furthermore, in the present embodiment, the gate electrode 181 is a gate electrode pad, the source electrode 182 is a source electrode pad, and the drain electrode 183 is a drain electrode pad.

Next, resin sealing is performed with mold resin 440 by a transfer mold method. As described above, a discretely packaged semiconductor chip that is a HEMT made of a GaN system material is manufactured.

Next, a description is given of the power unit and the high-frequency amplifier according to the present embodiment. The power unit and the high-frequency amplifier according to the present embodiment use either one of the semiconductor device according to the first embodiment or the semiconductor device according to the second embodiment.

Figure 8:
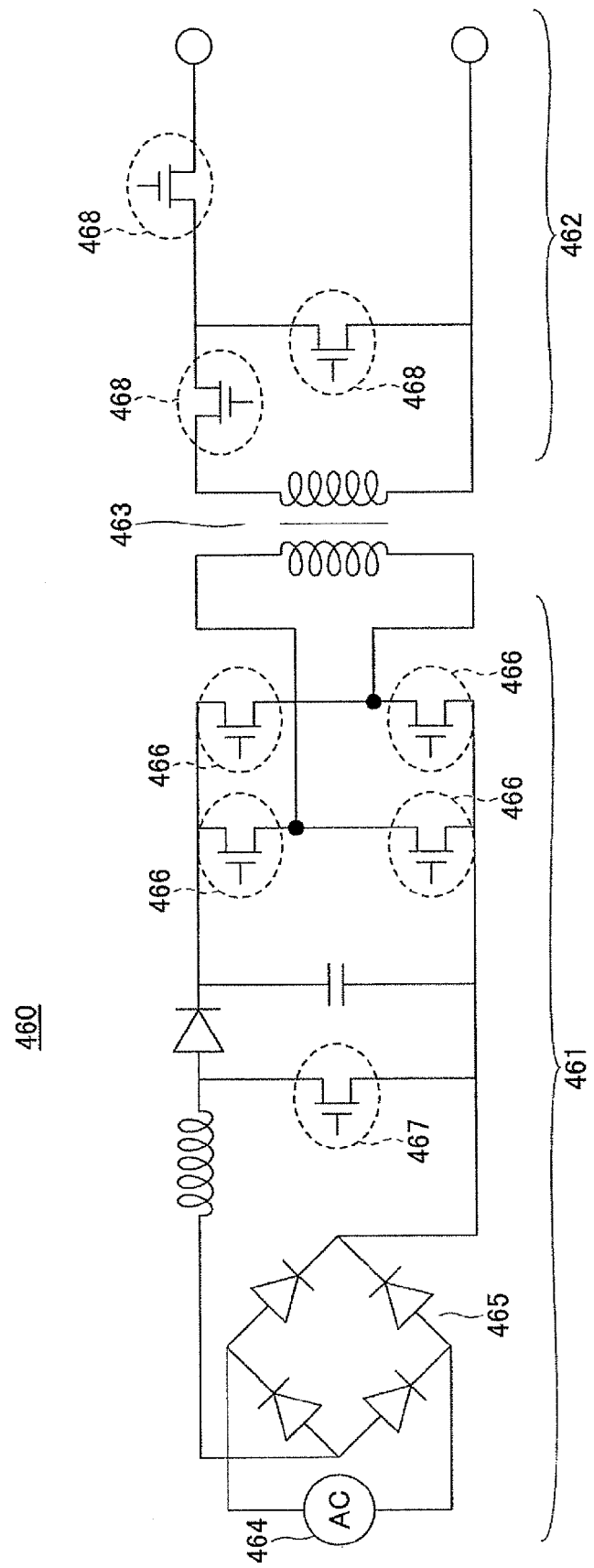
FIG. 8 is a circuit diagram of a power unit according to the third embodiment.

First, with reference to FIG. 8, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, a so-called bridge rectifier circuit 465, plural switching elements (four in the example of FIG. 8) 466, and one switching element 467. The low voltage secondary side circuit 462 includes plural switching elements 468 (three in the example of FIG. 11). In the example of FIG. 8, the semiconductor device according to the first and second embodiments is used as the switching elements 466 and the switching element 467 of the high voltage primary side circuit 461. The switching elements 466 and 467 of the primary side circuit 461 are preferably normally-off semiconductor devices. Furthermore, the switching elements 468 used in the low voltage secondary side circuit 462 are typical MISFET (metal insulator semiconductor field effect transistor) made of silicon.

Figure 9:
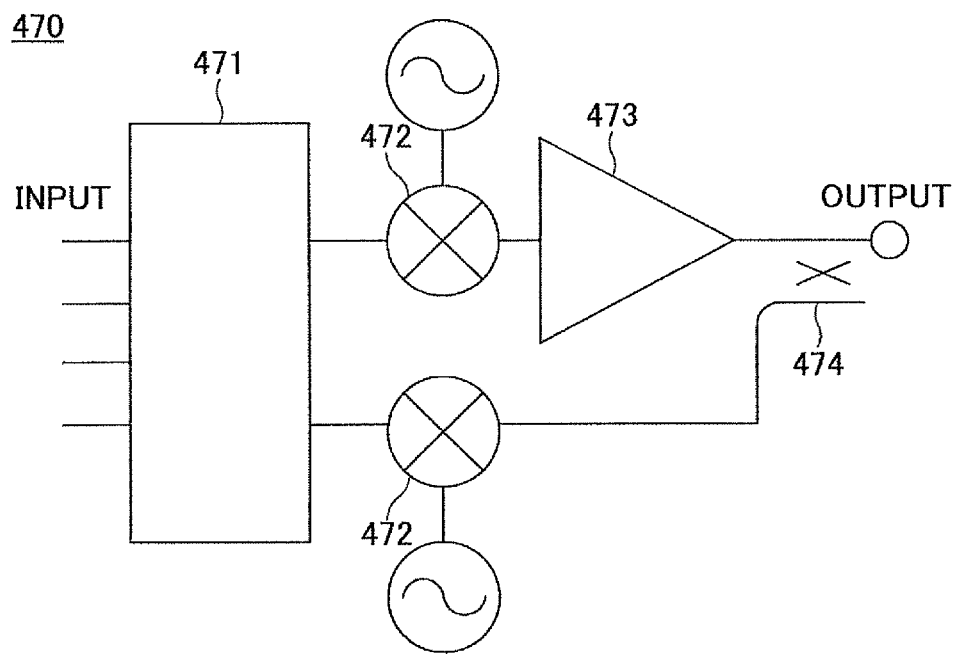
FIG. 9 illustrates a configuration of a high-frequency amplifier according to the third embodiment.

Next, with reference to FIG. 9, a description is given of the high-frequency amplifier according to the present embodiment. A high-frequency amplifier 470 according to the present embodiment may be applied to a power amplifier of a base station of mobile phones. The high-frequency amplifier 470 includes a digital predistortion circuit 471, mixers 472, a power amplifier 473, and a directional coupler 474. The digital predistortion circuit 471 offsets the non-linear strains of input signals. The mixers 472 mix the input signals, whose non-linear strains have been offset, with AC signals. The power amplifier 473 amplifies the input signals that have been mixed with the AC signals. In the example of FIG. 9, the power amplifier 473 includes the semiconductor device according to the first and second embodiments. The directional coupler 474 monitors input signals and output signals. In the circuit of FIG. 9, for example, the switch may be switched so that output signals are mixed with AC signals by the mixers 472 and sent to the digital predistortion circuit 471.

According to an aspect of the embodiments, a semiconductor crystal substrate and a manufacturing method of the semiconductor crystal substrate is provided, in which cracks are prevented from being formed along the outer periphery of the substrate, and a semiconductor device is manufactured with high yield and low cost.

The semiconductor crystal substrate, the manufacturing method of the semiconductor crystal substrate, the manufacturing method of the semiconductor device, the power unit, and the amplifier are not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor crystal substrate, the method comprising:
    forming a protection layer with a material including AN on a surface of a substrate, the substrate being made of any one of silicon, sapphire, silicon carbide, and gallium nitride, the protection layer including an outer peripheral area at an outer peripheral part of the substrate and an internal area surrounded by the outer peripheral area;
    implanting oxygen in the outer peripheral area of the protection layer;
    heating the substrate in which the oxygen is implanted in the outer peripheral area of the protection layer at a temperature so that the internal area of the protection layer is crystallized and the outer peripheral area of the protection layer after the substrate is heated remains in an amorphous state; and
    forming an amorphous-state semiconductor layer on the outer peripheral area of the protection layer and a crystallized semiconductor layer on the internal area of the protection layer,
    wherein the implanting of the oxygen in the outer peripheral area includes
    forming a mask layer on the protection layer in the internal area,
    radiating oxygen plasma on or ion-implanting oxygen in a surface of the protection layer on which the mask layer is formed in the internal area to implant the oxygen in the outer peripheral area of the protection layer, and
    removing the mask layer.

2. The method according to claim 1, wherein the mask layer is formed with a material including SiN.

3. A method of manufacturing a semiconductor device, the method comprising:
    forming a protection layer with a material including AN on a surface of a substrate, the substrate being made of any one of silicon, sapphire, silicon carbide, and gallium nitride, the protection layer including an outer peripheral area at an outer peripheral part of the substrate and an internal area surrounded by the outer peripheral area;
    implanting oxygen in the outer peripheral area of the protection layer;
    heating the substrate in which the oxygen is implanted in the outer peripheral area of the protection layer at a temperature so that the internal area of the protection layer is crystallized and the outer peripheral area of the protection layer after the substrate is heated remains in an amorphous state; and
    forming a buffer layer, an electron transit layer, and an electron supply layer, which are in an amorphous state without epitaxial growth, on the outer peripheral area of the protection layer and a buffer layer, an electron transit layer, and an electron supply layer, which are crystallized with epitaxial growth, on the internal area of the protection layer, after the heating of the substrate,
    wherein the implanting of the oxygen in the outer peripheral area includes
    forming a mask layer on the protection layer in the internal area,
    radiating oxygen plasma on or ion-implanting oxygen in a surface of the protection layer on which the mask layer is formed in the internal area to implant the oxygen in the outer peripheral area of the protection layer, and
    removing the mask layer.

4. The method according to claim 3, further comprising:
    forming a gate electrode, a source electrode, and a drain electrode on the electron supply layer, after the forming of the buffer layer, the electron transit layer, and the electron supply layer by epitaxial growth.

5. The method according to claim 3, wherein
the mask layer is formed with a material including SiN.

6. The method according to claim 3, wherein
the buffer layer, the electron transit layer, and the electron supply layer are formed by MOCVD.

7. The method according to claim 3, wherein
the buffer layer is formed with a material including AlGaN.

8. The method according to claim 3, wherein
the electron transit layer is formed with a material including GaN.

9. The method according to claim 3, wherein
the electron supply layer is formed with a material including AlGaN.

10. The method according to claim 3, wherein
the electron supply layer is formed with a material including InAlN.

11. The method according to claim 3, wherein
the semiconductor device is a HEMT,
the electron supply layer is formed with a material including AlGaN, and
the electron transit layer is formed with a material including GaN.

* * * * *